(12) United States Patent
Hulbert et al.

(10) Patent No.: US 8,258,788 B2
(45) Date of Patent: Sep. 4, 2012

(54) MAGNETIC RESONANCE SCANNER WITH WIRELESS TRANSMISSION OF UPCONVERTED SIGNALS AND RECEIVED SIDEBANDS OCCURRING OUTSIDE OF THE INDUSTRIAL, SCIENTIFIC, AND MEDICAL (ISM) BAND

(75) Inventors: Anthony Peter Hulbert, Southampton (GB); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 214 days.

(21) Appl. No.: 12/613,082

(22) Filed: Nov. 5, 2009

(65) Prior Publication Data

US 2010/0117646 A1    May 13, 2010

(30) Foreign Application Priority Data

Nov. 12, 2008 (GB) .................................. 0820687.2
Mar. 5, 2009 (GB) .................................. 0903725.0

(51) Int. Cl.
*G01V 3/00* (2006.01)
(52) U.S. Cl. ........................ 324/318; 324/322
(58) Field of Classification Search .......... 324/300–322; 600/410, 411, 422, 423; 382/128–131; 455/427, 455/330; 315/3.5
See application file for complete search history.

(56) References Cited

U.S. PATENT DOCUMENTS

| | | | | |
|---|---|---|---|---|
| 2,860,278 A * | 11/1958 | Cook et al. | ...................... | 315/3.5 |
| 3,015,072 A * | 12/1961 | Schultz-DuBois et al., | ...... | 330/4 |
| 3,588,678 A * | 6/1971 | Ernst | .............................. | 324/310 |
| 6,477,370 B1 * | 11/2002 | Sigler et al. | ................... | 455/427 |
| 6,961,604 B1 | 11/2005 | Vahasalo et al. | .............. | 600/410 |
| 7,417,433 B2 * | 8/2008 | Heid et al. | ..................... | 324/318 |
| 8,030,931 B2 * | 10/2011 | Hulbert | ......................... | 324/322 |
| 2007/0013376 A1 * | 1/2007 | Heid et al. | ..................... | 324/309 |
| 2009/0140739 A1 | 6/2009 | Bennett | ......................... | 324/318 |
| 2010/0117643 A1 * | 5/2010 | Hulbert | ......................... | 324/307 |
| 2010/0117646 A1 * | 5/2010 | Hulbert et al. | ................ | 324/309 |
| 2010/0117651 A1 * | 5/2010 | Evans | ............................ | 324/322 |
| 2010/0117652 A1 * | 5/2010 | Cork et al. | ..................... | 324/322 |
| 2010/0119138 A1 * | 5/2010 | Hulbert | ......................... | 382/131 |
| 2010/0253345 A1 * | 10/2010 | Vester | ............................ | 324/316 |
| 2010/0253346 A1 * | 10/2010 | Hulbert | ......................... | 324/316 |
| 2010/0253349 A1 * | 10/2010 | Cork et al. | ..................... | 324/318 |
| 2010/0253350 A1 * | 10/2010 | Huish et al. | .................... | 324/318 |
| 2010/0253351 A1 * | 10/2010 | Huish et al. | .................... | 324/318 |

(Continued)

OTHER PUBLICATIONS

"A Realization of Digital Wireless Transmission for MRI Signals Based on 802.11b," Wei et al, Journal of Magnetic Resonance, vol. 186 (2007) pp. 358-363.

*Primary Examiner* — Melissa Koval
*Assistant Examiner* — Tiffany Fetzner
(74) *Attorney, Agent, or Firm* — Schiff Hardin LLP

(57) ABSTRACT

A wireless magnetic resonance imaging scanner has one or more local coils, a microwave antenna array, and a local oscillator, and an upconverter. The local oscillator signal from the local oscillator is transmitted from the microwave antenna array to illuminate the local coils. The local coils generate magnetic resonance signals at a first frequency and the magnetic resonance signals at the first frequency are upconverted in the upconverter to microwave frequencies. The local oscillator operates at a frequency within an unlicensed band, chosen such that desired sidebands for reception of the upconverted local coil magnetic resonance signals fall outside the unlicensed band.

9 Claims, 2 Drawing Sheets

U.S. PATENT DOCUMENTS

2010/0253352 A1* 10/2010 Hulbert ............... 324/318
2010/0253353 A1* 10/2010 Cork et al. ........... 324/318
2010/0253354 A1* 10/2010 Hulbert et al. ....... 324/322
2010/0256481 A1* 10/2010 Mareci et al. ........ 600/423
2011/0012596 A1* 1/2011 Menon et al. ........ 324/309
2011/0059716 A1* 3/2011 Cork ..................... 455/330

* cited by examiner

MAGNETIC RESONANCE SCANNER WITH WIRELESS TRANSMISSION OF UPCONVERTED SIGNALS AND RECEIVED SIDEBANDS OCCURRING OUTSIDE OF THE INDUSTRIAL, SCIENTIFIC, AND MEDICAL (ISM) BAND

RELATED APPLICATIONS

The present application is related to the following applications filed simultaneously herewith and having the respective.

BACKGROUND OF THE INVENTION

1. Field of the Invention

This invention relates to a wireless magnetic resonance imaging (MRI) scanner (data acquisition unit) and to a method of operation of the scanner, using unlicensed spectrum for a local oscillator for upconversion.

2. Description of the Prior Art

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The coils that receive signals from the back of the patient are mounted in the patient table. Coils that receive signals from the front of the patient are arranged into 'blankets' that are carefully placed over the patient. Associated with each blanket is typically a flexible cable containing one co-axial line for each local coil. The cables potentially interact with the $B_1$ field and with the signals generated from the patient so 'traps' (high impedance sections) must be included at regular (typically $\lambda/8$) intervals. These add cost and inconvenience to the structure.

In use, the requirement to connect the cables and sterilize them between scanning one patient and the next leads to increased down-time between scans. It is therefore desirable that the cables be eliminated. However, a wireless solution permitting the cables to be eliminated also ideally substantially satisfies all the requirements of the existing system, particularly in the area of noise figure.

SUMMARY OF THE INVENTION

In accordance with a first aspect of the present invention, a wireless magnetic resonance imaging scanner has one or more local coils; a microwave antenna array; and a local oscillator; and an upconverter. A local oscillator signal from the local oscillator is transmitted from the microwave antenna array to illuminate the local coils. The local coils generate magnetic resonance signals at a first frequency, and the magnetic resonance signals at the first frequency are upconverted in the upconverter to microwave frequencies. The local oscillator operates at a frequency within an unlicensed band, chosen such that desired sidebands for reception of the upconverted local coil magnetic resonance signals fall outside the unlicensed band.

Preferably, only one sideband of upper and lower sidebands of the local coil magnetic resonance signals is desired.

Preferably, the desired sidebands fall outside a spillover region of the unlicensed spectrum.

In one embodiment, the local oscillator frequency for upper sideband reception is greater than the resultant of the maximum frequency of the unlicensed band less the Larmor frequency plus the Larmor frequency required half bandwidth plus the maximum frequency spillover outside the unlicensed band.

In another embodiment, the local oscillator frequency for lower sideband reception is less than the resultant of the minimum frequency of the unlicensed band plus the Larmor frequency less the Larmor frequency required half bandwidth less the maximum frequency spillover outside the unlicensed band.

Preferably, the local oscillator frequency for reception of both sidebands falls between the local oscillator frequency for upper sideband reception and the local oscillator frequency for lower sideband reception.

Preferably, the maximum unlicensed band bandwidth in which the wireless magnetic resonance imaging scanner is operated is less than the resultant of twice the Larmor frequency less the Larmor frequency required bandwidth less twice the maximum frequency spillover outside the unlicensed band.

Preferably, the local oscillator frequency is in one of the Industrial, Scientific and Medical (ISM) frequency bands.

Preferably, the local oscillator frequency is in the 2.4 GHz ISM band.

Preferably, the microwave antenna array and local oscillator are mounted on a bore tube and the local coils are mounted at least partially within a central bore of the bore tube.

In accordance with a second aspect of the present invention, a method of operation of a wireless magnetic resonance imaging scanner includes transmitting a local oscillator signal from a microwave antenna array to illuminate one or more local coils, generating magnetic resonance signals in the local coils at a first frequency, and upconverting the local coil magnetic resonance signals at the first frequency to microwave frequencies, and setting the operating frequency of the local oscillator in a range of frequencies in an unlicensed frequency band, to cause sidebands of desired upconverted local coil signals to fall outside the unlicensed frequency band.

DESCRIPTION OF THE PREFERRED EMBODIMENTS

The wireless concept to which the features of the present invention apply is based on upconversion of the RF (Larmor) frequency signals to microwave frequencies and transmission from local coils located in the patient blanket to microwave antennas located on the bore of the scanner. The combination of transmit and receive antennas on the patient and bore respectively constitutes a MIMO (Multiple Input/Multiple Output) system that allows individual signals from the patient antennas to be resolved. A wireless system greatly enhances the utility of MRI scanners by removing the requirement for cable connections to patient coils and gives rise to significant work flow benefits from eliminating the need to sterilize, connect and disconnect the cables. With substantially no reduction of bore size, an increased coil density above the current norms may be achieved, as well as improving scanner workflow. The present invention relates to the bore tube for use in the system described above and in particular to an arrangement of the microwave antenna arrays.

Figure 1:
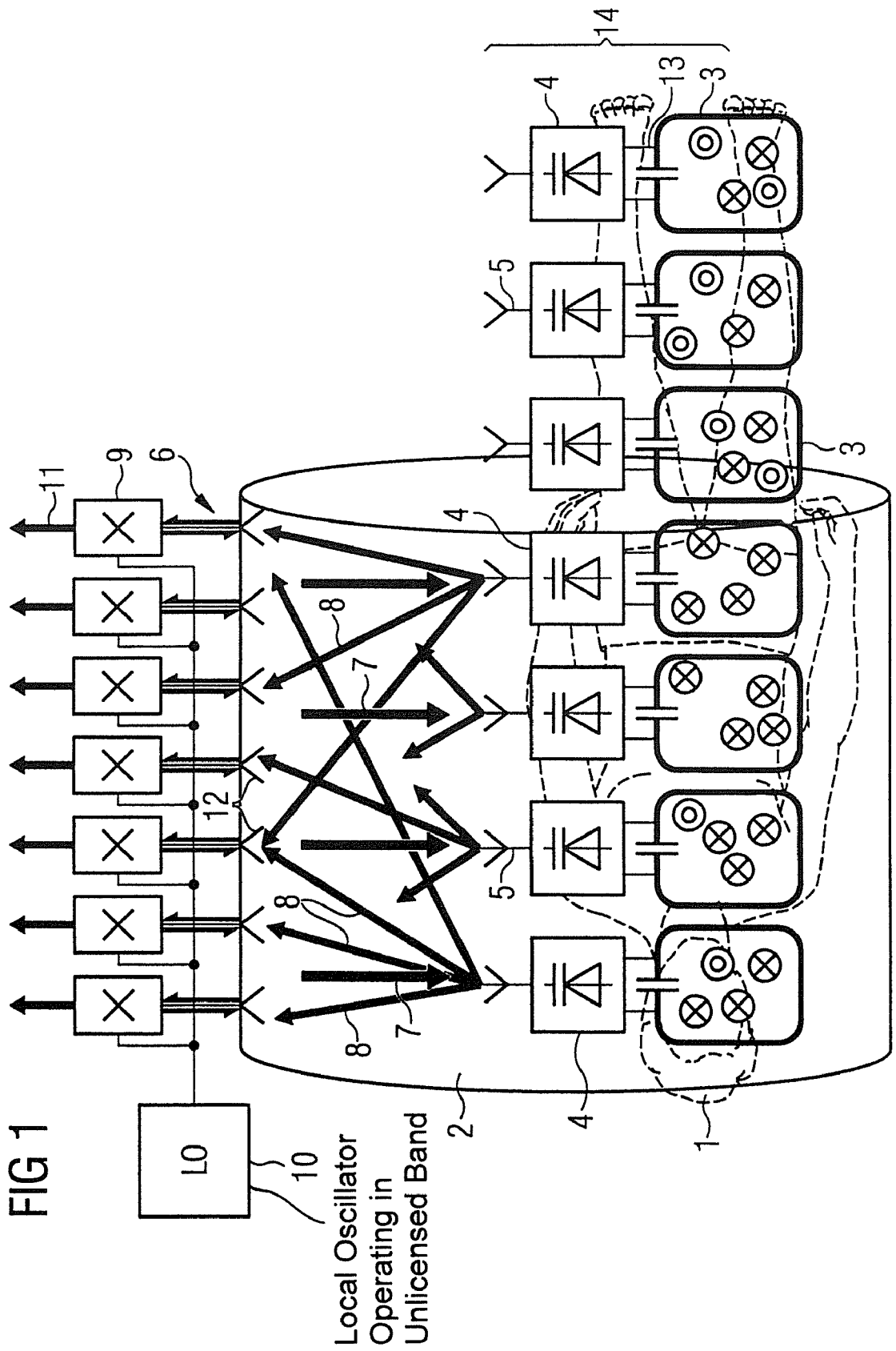
FIG. 1 illustrates a wireless MRI system incorporating a scanner in accordance with the present invention.

An example of an MRI system using a MIMO microwave link, suitable for operating in accordance with the present invention will now be described. FIG. 1 shows a patient 1 within an MRI scanner bore tube 2. A blanket covers the patient and embedded in the blanket are a number of local coils 3 forming a local coil array 14. Each local coil 3 has an associated upconverter 4 and microwave antenna 5. Transceivers 9, comprising MR receivers and frequency downconverters, connected to an array 6 of antennas 12 are integrated into the scanner bore 2. The frequency upconverter 4 for each patient mat coil 3 produces signals for transmission to the array of transceivers in the scanner bore 2. A local oscillator signal from local oscillator 10 feeds the antenna array 6 to illuminate the patient coil electronics 14 with a signal 7 at the local oscillator frequency. The same local oscillator signal in the transceivers converts the microwave signals 8, received from the patient coils 3 at the LO frequency±63 MHz, back to the original magnetic resonance (MR) frequency of 63 MHz for a 1.5 Tesla magnet for input 11 to the MR receivers in the transceivers 9. The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

A wireless solution based on upconversion of RF (Larmor) frequency signals to microwave frequencies and transmission from the local coils locations to microwave antennas located on the bore of the scanner, uses parametric amplifiers to perform the upconversion of the local coil signals from the Larmor frequency to microwave frequencies, although the scope of this invention is not limited to such operation.

The operation of the parametric amplifiers requires the transmission of a local oscillator from microwave antennas on the inner surface of the MRI bore. In order that such transmission satisfies regulatory requirements for transmission in all parts of the world where such an MRI scanner might be operated, as well as the upconverted sidebands from the Larmor frequency signal operating in a quiet part of the spectrum, the present invention is provided.

MRI scanners are operated inside a screened room, whether fixed or mobile, that has been designed to provide adequate attenuation to prevent interference to and from external devices operating at or close to the Larmor frequency. Such screened rooms are not specifically designed to attenuate signals at microwave frequencies. However, their design is such that some useful attenuation will inevitably result at microwave frequencies and, indeed, this has been confirmed by measurement. This attenuation is adequate for preventing interference between the upconverted signals and equipment operating outside the scanner suite, but may not be quite enough to meet regulatory requirements for undesired emission in bands licensed for other use for the local oscillator transmissions, which tend to be substantially stronger than other types of uses such as short range communications.

Not all spectrum is licensed for use. Certain bands remain license-free. Such unlicensed spectrum has been constrained to be operated only when certain technical criteria are met, rather than by determining who the permitted user is, i.e. the licensee of the licensed spectrum. The technical criteria may include where a transmitter is deployed, or the type of hardware used. Another constraint may be the maximum permitted transmission power. The precise details vary from country to country and from band to band. For one of the bands of interest in this application, the 2.4 GHz Industrial, Scientific and Medical (ISM) band, the band extends from 2.400 GHz to 2.4835 GHz.

The use of an unlicensed band for transmission of the local oscillator enables the requirement for legal transmission to be satisfied. However, it may be desirable to operate other devices using unlicensed spectrum inside the scanner screened room, such as, for example, a Bluetooth breathing monitor.

Figure 2:
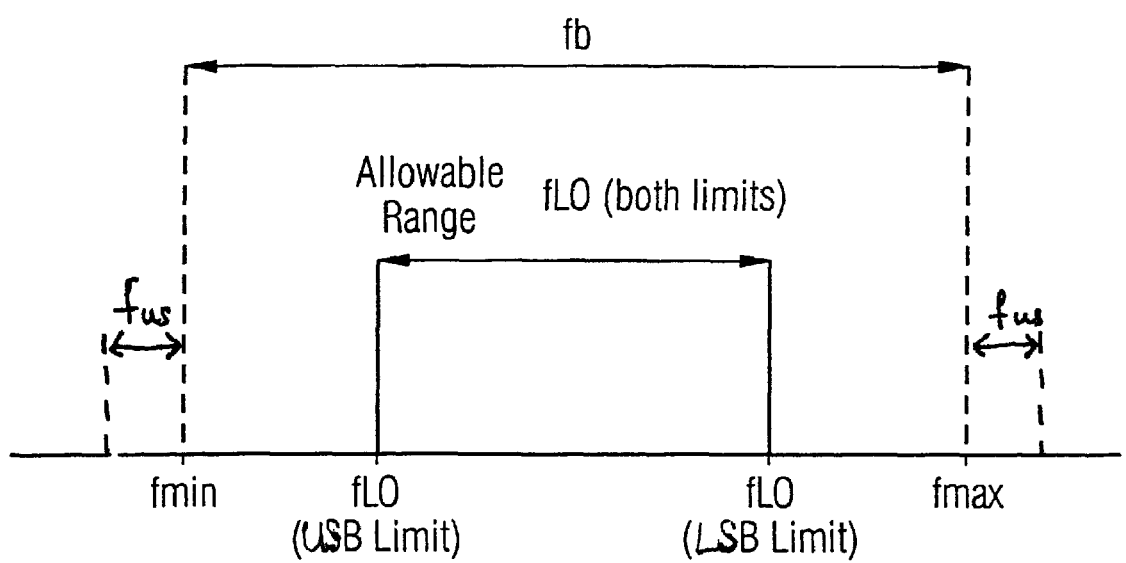
FIG. 2 illustrates the relative frequency ranges used in operating the scanner of the present invention.

The present invention allows the local oscillator to operate in an unlicensed band, but a local oscillator frequency is selected such that desired sideband(s) for reception fall outside that unlicensed band since other equipment using the unlicensed band does not use these areas and the generated signals there are weak. This avoids interference with the other devices. As can be seen in FIG. 2, there will be a range over which a local oscillator frequency can satisfy the requirements to avoid interference. Where both sidebands are used for reception, the selected frequency needs to be close to the centre of the unlicensed band, such that both sidebands fall outside the unlicensed band. This is explained in more detail below.

Let the Larmor frequency be $f_L$ and let the minimum and maximum frequencies of the unlicensed band be $f_{MIN}$ and $f_{MAX}$ respectively, such that the bandwidth of the unlicensed band is $f_B = f_{MAX} - f_{MIN}$, as shown in FIG. 2.

The MR signal has finite bandwidth—typically about 200 kHz—and some frequency variability due to the slowly decaying magnetic field—typically together these account for a total receivable bandwidth of 500 kHz or ±Larmor frequency half band width ($f_{LBW}$)=250 kHz. Additionally, equipment operating in the unlicensed band will not have perfect spectral masks. Equipment using the lowest, or highest frequency channels in the unlicensed band can generate interference outside the unlicensed band. Ideally, a local oscillator frequency is chosen that places the desired sideband(s) frequencies beyond the spillover interference spectrum. The maximum frequency spillover outside the unlicensed band is denoted as $f_{US}$.

In order to select the local oscillator frequency, $f_{LO}$ to satisfy the above requirements the following is necessary:—

For upper sideband reception only, $$f_{MAX} - f_{LO} < f_L - f_{LBW} - f_{US},$$

so $f_{LO} > f_{MAX} - f_L + f_{LBW} - f_{US}$

For lower sideband reception only, $$f_{LO} - f_{MIN} < f_L - f_{LBW} - f_{US},$$

so $f_{LO} < f_{MIN} + f_L - f_{LBW} - f_{US}$

For reception of both sidebands, $$f_{MAX} - f_L + f_{LBW} + f_{US} < f_{LO} < f_{MIN} + f_L - f_{LBW} - f_{US}$$

Satisfaction of both requirements for double sideband reception requires that the upper limit exceeds the lower limit. The maximum unlicensed band bandwidth for which the condition can be met applies where:

$$f_{MAX} - f_L + f_{LBW} + f_{US} < f_{MIN} + f_L - f_{LBW} - f_{US}.$$

This gives $f_{MAX} - f_{MIN} = f_B < 2(f_L - f_{LBW} - f_{US})$

As an example, the case of an MRI scanner is considered wherein the scanner's static magnetic field is 1.5 Tesla. For this case the Larmor frequency, $f_L$=63.6 MHz. The use of the 2.4 GHz unlicensed band considered. A bandwidth, $f_B$, of 83.5 MHz is used. Moreover, $f_{LBW}$=0.25 MHz and spectral spillover, $f_{US}$, of 10 MHz is allowed. Then $f_B$<2(63.6−10−0.25), i.e. $f_B$<106.7 MHz, which is satisfied for the 2.4 GHz band. The limits for the local oscillator frequency then become 2.43015 to 2.45335 GHz. Generally, the local oscillator is chosen to be close to the centre of the unlicensed band. If the local oscillator transmission is close to one edge, then one side band could fall inside the unlicensed band. For a 3T system this is less of an issue than with a 1.5T system because $f_L$ is twice as large.

Although modifications and changes may be suggested by those skilled in the art, it is the intention of the inventors to embody within the patent warranted hereon all changes and modifications as reasonably and properly come within the scope of their contribution to the art.

We claim as our invention:

1. A wireless magnetic resonance imaging data acquisition device, comprising:
    Radio Frequency (RF) local coils and gradient coils operable to obtain magnetic resonance data from a subject, a microwave antenna array, a local oscillator, and an upconverter;
    said local oscillator supplying a local oscillator signal from the microwave antenna array in order to operate the local coils;
    said local coils generating said magnetic resonance signals at a first frequency, and said upconverter upconverting said magnetic resonance signals at said first frequency into microwave frequencies; and
    said local oscillator emitting a local oscillator frequency in the 2.4 GHz Industrial, Scientific, and Medical (ISM) band in order to cause desired sidebands for reception of the upconverted local coil magnetic resonance signals to be located outside of said ISM band.

2. A device as claimed in claim 1 wherein only a sideband among said upper and lower sidebands of said local coil magnetic resonance signals is desired.

3. A device as claimed in claim 2 wherein the desired sidebands occur outside of a spillover region of said ISM band.

4. A device as claimed in claim 2 wherein said local oscillator supplies a local oscillator frequency configured for upper sideband reception that is greater than a resultant of a maximum frequency of the unlicensed spectrum band with the Larmor frequency subtracted therefrom, plus the Larmor frequency-required half bandwidth, plus a maximum frequency spillover outside of the ISM band.

5. A device as claimed in claim 2 wherein the local oscillator supplies a local oscillator frequency configured for lower sideband reception that is less than a resultant of the minimum frequency of the ISM band plus the Larmor frequency, with the Larmor frequency-required half bandwidth subtracted therefrom and with a maximum frequency spillover occurring outside of the ISM band subtracted therefrom.

6. A device as claimed in claim 1 wherein said local oscillator supplies a local oscillator frequency configured for reception of both sidebands that occurs between a local oscillator frequency configured for upper sideband reception and a local oscillator frequency configured for lower sideband reception.

7. A device as claimed in claim 1 wherein a maximum ISM band bandwidth, in which said device is operated, is less than twice the Larmor frequency with the Larmor frequency-required bandwidth subtracted therefrom, and with twice a maximum frequency spillover occurring outside of the ISM band subtracted therefrom.

8. A device as claimed in claim 1 wherein said microwave antenna array and said local oscillator are mounted in a bore tube of said device, and said local coils are mounted at least partially within a central bore with said bore tube.

9. A wireless magnetic resonance imaging data acquisition device, comprising:
    A magnetic resonance data acquisition unit comprising
        Radio Frequency (RF) local coils and gradient coils operable to obtain magnetic resonance data from a subject,
        a microwave antenna array,
        a local oscillator, and
        an upconverter;
        said local oscillator supplying a local oscillator signal from the microwave antenna array in order to operate the local coils;
        said local coils generating said magnetic resonance signals at a first frequency, and said upconverter upconverting said magnetic resonance signals at said first frequency into microwave frequencies; and
        said local oscillator emitting at a local oscillator frequency in the 2.4 GHz Industrial, Scientific, and Medical (ISM) band in order to cause desired sidebands for reception of the upconverted local coil magnetic resonance signals to be located outside of said ISM band.

* * * * *